United States Patent
Cherlin et al.

(10) Patent No.: US 10,254,163 B1
(45) Date of Patent: Apr. 9, 2019

(54) INTERACTION CHARACTERISTICS FROM A PLURALITY OF PIXELS

(71) Applicant: KROMEK GROUP, PLC, Sedgefield, County Durham (GB)

(72) Inventors: Alexander Cherlin, Newcastle Upon Tyne (GB); Ian Radley, Durham (GB); James William Hugg, Mars, PA (US)

(73) Assignee: KROMEK GROUP, PLC, Sedgefield, County Durham (GB)

( * ) Notice: Subject to any disclaimer, the term of this patent is extended or adjusted under 35 U.S.C. 154(b) by 0 days.

(21) Appl. No.: 15/922,598

(22) Filed: Mar. 15, 2018

(51) Int. Cl.
| | |
|---|---|
| *G01J 1/44* | (2006.01) |
| *G01T 1/17* | (2006.01) |
| *H01L 31/0336* | (2006.01) |
| *H01L 31/028* | (2006.01) |
| *H01L 31/0272* | (2006.01) |
| *H04N 5/378* | (2011.01) |

(52) U.S. Cl.
CPC .............. *G01J 1/44* (2013.01); *G01T 1/17* (2013.01); *H01L 31/028* (2013.01); *H01L 31/02725* (2013.01); *H01L 31/0336* (2013.01); *H04N 5/378* (2013.01)

(58) Field of Classification Search
CPC ...... H04N 5/378; H04N 5/374; H01L 31/028; G01J 1/46; G01J 1/44; G01T 1/17
See application file for complete search history.

(56) References Cited

U.S. PATENT DOCUMENTS

| | | | |
|---|---|---|---|
| 6,169,287 B1 | 1/2001 | Warburton | |
| 7,078,669 B2 | 7/2006 | Mikkelsen | |
| 7,378,663 B2 | 5/2008 | D'Allon | |
| 7,518,118 B2 | 4/2009 | Harrison | |
| 8,405,038 B2 | 3/2013 | Bouhnik | |
| 8,466,420 B2 | 6/2013 | Wangerin | |
| 8,586,937 B2 | 11/2013 | Bouhnik | |
| 9,482,764 B1 | 11/2016 | Shahar | |
| 9,989,623 B2 * | 6/2018 | Send | G01S 7/4816 |

* cited by examiner

*Primary Examiner* — David P Porta
*Assistant Examiner* — Faye Boosalis
(74) *Attorney, Agent, or Firm* — Ference & Associates LLC

(57) ABSTRACT

One embodiment provides a method, including: receiving a plurality of responses to an interaction occurring within a photon detector pixel array, wherein the photon detector pixel array comprises a plurality of pixels; identifying a subset of the plurality of pixels associated with the interaction, wherein each of the subset of the plurality of pixels corresponds to at least one of the plurality of responses; and determining, from the plurality of responses, a characteristic of the interaction, wherein the characteristic comprises at least one of: time, position, and energy of the interaction. Other aspects are described and claimed.

19 Claims, 6 Drawing Sheets

INTERACTION CHARACTERISTICS FROM A PLURALITY OF PIXELS

BACKGROUND

Imaging devices perform many different functions such as medical imaging, security screening, image capture, or the like. The source of the imaging may be a radiological source, visible light, non-visible light, or any type of source for which the imaging device is capable of detection. For example, in a medical setting, a patient may be injected with a radiopharmaceutical tracer agent and the imaging device may capture the emission of gamma photon radiation from the patient's body for diagnostic analysis. The imaging device may include a gamma camera sensitive to the emission source, for example, a camera including a specific substance or object that is sensitive to or reacts to the emission source. The camera may contain individual pixels which may allow the image to determine the location, energy, timing, and intensity of the emitted signal.

BRIEF SUMMARY

In summary, one aspect provides a method, comprising: receiving a plurality of responses to an interaction occurring within a photon detector pixel array, wherein the photon detector pixel array comprises a plurality of pixels; identifying a subset of the plurality of pixels associated with the interaction, wherein each of the subset of the plurality of pixels corresponds to at least one of the plurality of responses; and determining, from the plurality of responses, a characteristic of the interaction, wherein the characteristic comprises at least one of: time, position, and energy of the interaction.

Another aspect provides an apparatus comprising: a photon detector pixel array comprising a plurality of pixels; a processor operatively coupled to the photon detector pixel array; a memory device that stores instructions executable by the processor to: receive a plurality of responses to an interaction occurring within a photon detector pixel array; identify a subset of the plurality of pixels associated with the interaction, wherein each of the subset of the plurality of pixels corresponds to at least one of the plurality of responses; and determine, from the plurality of responses, a characteristic of the interaction, wherein the characteristic comprises at least one of: time, position, and energy of the interaction.

A further aspect provides a product, comprising: a storage device that stores code, the code being executable by a processor and comprising: code that receives a plurality of responses to an interaction occurring within a photon detector pixel array, wherein the photon detector pixel array comprises a plurality of pixels; code identifies a subset of the plurality of pixels associated with the interaction, wherein each of the subset of the plurality of pixels corresponds to at least one of the plurality of responses; and code that determines, from the plurality of responses, a characteristic of the interaction, wherein the characteristic comprises at least one of: time, position, and energy of the interaction.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

Figure 1:
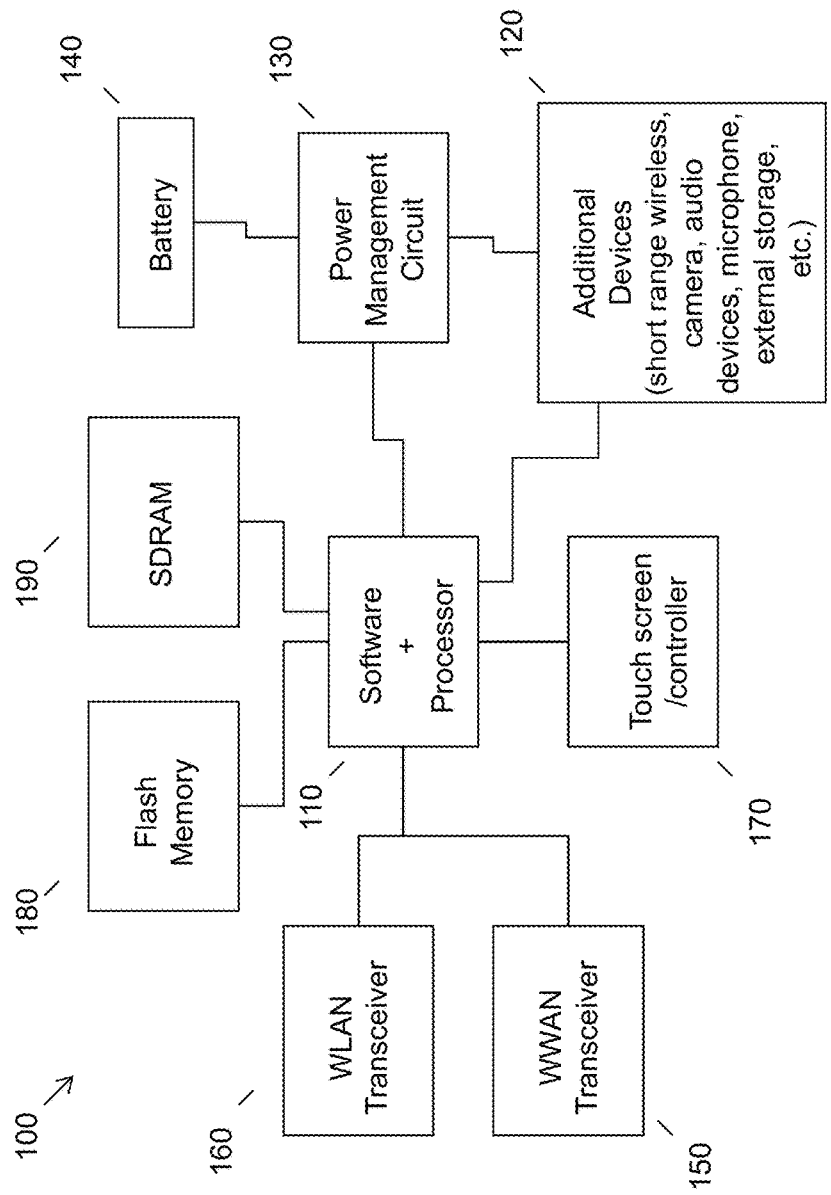
FIG. 1 illustrates an example of information handling device circuitry.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

Users of imaging devices often desire image output of a high spatial, temporal, and energy resolution. For example, a medical image having high spatial, temporal, and energy resolution may influence a patient's care by directing a physician to a location of interest within the patient's body. Many imaging devices utilize a camera sensitive to the type of emission being imaged in order to accurately capture an image. To capture the image, the camera image is divided into discrete areas or picture elements (pixels), where each pixel may represent both a location and an intensity within the image captured.

By way of illustration, in a nuclear medicine (molecular imaging) setting, a patient may be injected with a radiopharmaceutical tracer agent and the imaging device (gamma camera) may capture the emission of gamma photon radiation from the patient's body for diagnostic analysis. The detectors in a gamma camera may comprise semiconductor direct-conversion materials such as CdZnTe, CdTe, HgI, and Si. A gamma photon detector pixel array comprising a semiconductor direct-conversion detector material has advantages over scintillator photon detector gamma cameras, including superior energy and spatial resolution. However, a disadvantage of such pixelated semiconductor detector arrays is a distortion of the energy spectrum of individual pixels in which some of the counts are recorded with a lower energy than the photopeak because of hole carrier trapping or charge sharing with neighbor pixels. Since image formation typically may require accepting counts only within a range of energies closely surrounding the photopeak, the counts in the lower energy spectral tail are not included in the image. This means that the gamma camera may be apparently less efficient than a scintillator camera, even if the thickness of each camera provides the same stopping power for gamma photons. This invention provides a novel solution to the charge sharing and hole trapping spectral tail problem.

The principals which led us to this invention depend upon a deep proprietary understanding of photon interactions in CdZnTe detectors and signal formation in pixelated CdZnTe detectors. However, the invention can be understood at a high level. When a gamma photon is incident upon a pixelated CdZnTe detector, preferably from the cathode side, the photon may Compton scatter zero or multiple times before depositing its remaining energy in a photoelectric interaction. These interactions may occur within a single pixel or within multiple pixels. The interactions are directly converted into a charge cloud of electrons and holes. The detector is under an electric field, typically about 100 volts per mm, with the pixelated anodes at ground potential and the typically monolithic cathode at high negative voltage. Thus, the holes are accelerated toward the cathode and the electrons toward the pixelated anodes. Since the hole mobility is typically much less than the electron mobility, it takes longer to sweep out the holes than the electrons and there is a greater possibility of trapping the holes in crystal defects. When the pixels are smaller than the thickness of the detector, then the device is much more sensitive to electrons than holes, due to the "small pixel effect."

As the electron cloud approaches the anodes, an induced voltage is detected on multiple anodes. When the charge cloud reaches the anode plane, the charge is collected on one or several pixels. Any neighboring pixel that detected an induced voltage will then detect an opposite polarity voltage, such that the integral over time for any non-charge collecting pixel will be zero. Thus, there are several ways in which signals may be shared between a plurality of pixels: the charge may be shared when the electron charge cloud overlaps several pixels, the photon interactions may have occurred in several pixels, due to Compton scattering or k-escape x-rays, and transient induced voltages may be detected on a plurality of neighboring pixels. Of course, hole charges are collected on the cathode and that information could be used to estimate the depth of interaction for the incident photon. This invention, however, explicitly does not use any cathode signal to determine the characteristics of the photon interaction. Furthermore, this invention uses only the positive and negative peak amplitudes of anode pixel signals, rather than requiring the digitization of the entire pixel signal waveforms. This is a tremendous simplification that makes determination of interaction characteristics a relatively simple matter of combining information from peak signal amplitudes of a plurality of anode pixels.

As with any device, there exists the problem of determining the location and energy of a signal upon a detector. A photon or particle may enter the receiving imaging unit such that the interaction of the incident photon or particle with the material of the imaging unit causes a signal to be produced at multiple pixels or detection areas. This problem may occur in the example of a photon that enters an imaging unit at an angled trajectory. A photon entering a detection unit may strike one or more pixels. In other words, a photon may enter the detector at an angle and pass through a pixel detection region or multiple pixel regions before the termination of the photon trajectory. This causes a problem, known as parallax error, in determining the exact location and intensity of the interaction. Thus, the image that is produced may include an image that indicates locations of pixel interactions that did not actually occur. In a medical setting an imaging device that cannot determine the received energy signal by many pixels may provide a healthcare professional with incomplete or erroneous data.

Current systems may have difficulty in attributing detected charges to the correct interaction, thereby resulting in images that have lower accuracy. Currently, many imaging devices rely on a signal or a plurality of signals from individual pixels to identify locations of interactions. Imaging techniques may take a signal from individual pixels from the imaging device's detection unit. In this manner, the imaging unit may receive a "pixelated" image of a received signal. Therefore, one central pixel may have a high value and neighboring pixels may have a lower value. However, data of how the neighboring pixel values correlate to a central pixel value may be lost in the imaging technique. For example, when a photon enters an imaging detection unit the photon may interact with multiple pixels, thereby creating signals from all the pixels that were interacted with. For example, the pixel having the main interaction may provide a signal indicating that pixel received the greatest energy from the photon and neighboring pixels may have a lesser energy value. However, it may be difficult to determine exactly where in the pixel area the photon struck. The loss of data of neighboring pixels diminishes the resolution of the imaging unit. Lower resolution of an imaging unit may lead to decreased efficiency in medical care. For example, patients may require further imaging, diagnoses may be missed, imaging sessions may be longer, costs may rise, or the like.

Additionally, to determine the exact location of the pixel interaction, for example, not only a two-dimensional position, but also a third dimensional depth position, conventional systems require the use of both pixelated anode and (typically non-pixelated) cathode signals. These signals can be correlated and from the relative strength and/or timing of the signals it can be determined at what depth the interaction occurred. Capturing the cathode signal may be very difficult for some detector systems, particularly for larger imaging systems, because of the high bias voltage decoupling circuitry required. In other words, the cathode signal may be able to be determined or captured as long as the imaging system is small, but once the imaging system increases in size, it may be very difficult to capture the signal from the cathode.

Accordingly, an embodiment provides a system and method of using signals from neighboring anode pixels which may allow for identification of a depth of interaction or other characteristic associated with the interaction. The depth of interaction is able to be determined without capturing a signal from the cathode. Rather, the system uses anode signals from not only the central pixel of interaction, but also from the neighboring pixels which have also received an energy signal. In an embodiment, an imaging system may include a photon pixel array comprising a first side with a plurality of anode pixels and a second side with an electrode (cathode) opposite the first side. The photon pixel array may receive an incident photon that may interact with one or more pixels of the array. In an embodiment, the system and method may identify a plurality of pixels associated with the interaction, for example, a main pixel of interaction, referred to as a central pixel, and neighboring pixels that may also provide an energy signal. In an embodiment, each of the central pixel and neighboring pixels provide a response or signal to the interaction. In an embodiment, a characteristic of the interaction may be determined, for example, a position of the interaction (including depth), a temporal characteristic, energy characteristic, or the like.

Such systems and methods provide a technical improvement to current imaging techniques. Rather than requiring signals from both the cathode and anode of the detector, the embodiments as described herein capture information from both a central anode pixel and neighboring anode pixels. Using these values, the system can identify a depth of interaction, thereby providing a system and method for providing images with higher resolution by being able to more accurately identify characteristics regarding the interaction, without needing cathode signals which may be difficult to obtain. The system may use a signal from neighboring anodes, which may account for charge shared between central pixel and neighbors. Typically, those shared events may not be counted. It may be possible to recombine that information and correct characteristics regarding an interaction. By correcting characteristics regarding an interaction, it is possible to improve energy resolution. These improvements may be important for medical imaging, lower patient dosing of imaging reagents, reduce exam/procedure time, or the like.

The illustrated example embodiments will be best understood by reference to the figures. The following description is intended only by way of example, and simply illustrates certain example embodiments.

One embodiment of deriving interaction characteristics from a plurality of pixels applies to smart phones, tablets, and the like, that ubiquitously include a pixelated optical photography camera and display of the pixelated image. While various other circuits, circuitry or components may be utilized in information handling devices, with regard to smart phone and/or tablet circuitry 100, an example illustrated in FIG. 1 includes a system on a chip design found for example in tablet or other mobile computing platforms. Software and processor(s) are combined in a single chip 110. Processors comprise internal arithmetic units, registers, cache memory, busses, I/O ports, etc., as is well known in the art. Internal busses and the like depend on different vendors, but essentially all the peripheral devices (120) may attach to a single chip 110. The circuitry 100 combines the processor, memory control, and I/O controller hub all into a single chip 110. Also, systems 100 of this type do not typically use SATA or PCI or LPC. Common interfaces, for example, include SDIO and I2C.

There are power management chip(s) 130, e.g., a battery management unit, BMU, which manage power as supplied, for example, via a rechargeable battery 140, which may be recharged by a connection to a power source (not shown). In at least one design, a single chip, such as 110, is used to supply BIOS like functionality and DRAM memory.

System 100 typically includes one or more of a WWAN transceiver 150 and a WLAN transceiver 160 for connecting to various networks, such as telecommunications networks and wireless Internet devices, e.g., access points. Additionally, devices 120 are commonly included, e.g., an image sensor such as a camera. System 100 often includes a touch screen 170 for data input and display/rendering. System 100 also typically includes various memory devices, for example flash memory 180 and SDRAM 190. The components described herein may be adapted for use in an imaging device.

Figure 2:
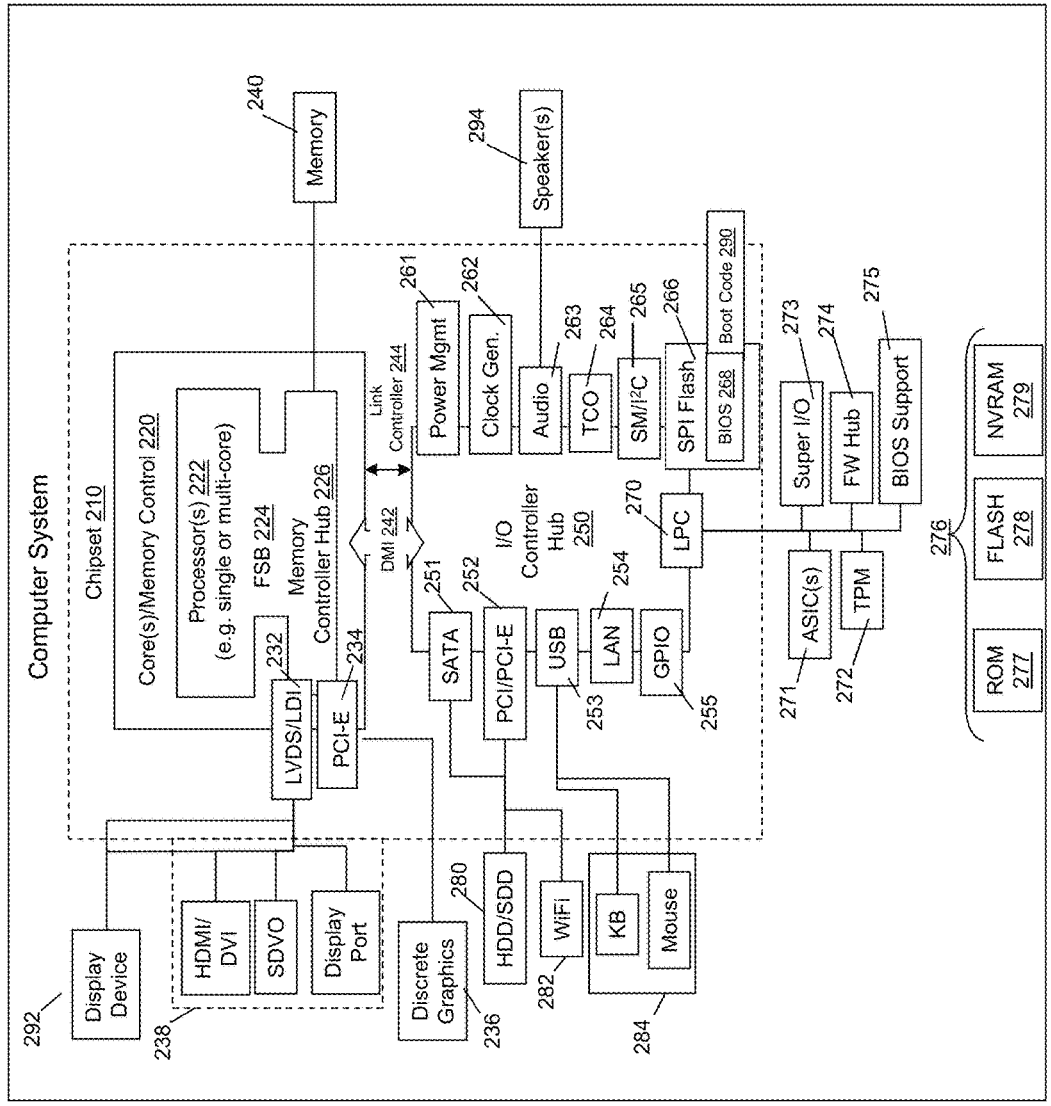
FIG. 2 illustrates another example of information handling device circuitry.

FIG. 2 depicts a block diagram of another example of information handling device circuits, circuitry or components. The example depicted in FIG. 2 may correspond to computing systems such as personal computers, laptop computers, or other devices that may embody deriving interaction characteristics from a plurality of pixels for the pixelated digital cameras such devices ubiquitously comprise. As is apparent from the description herein, embodiments may include other features or only some of the features of the example illustrated in FIG. 2.

The example of FIG. 2 includes a so-called chipset 210 (a group of integrated circuits, or chips, that work together, chipsets) with an architecture that may vary depending on manufacturer (for example, INTEL, AMD, ARM, etc.). INTEL is a registered trademark of Intel Corporation in the United States and other countries. AMD is a registered trademark of Advanced Micro Devices, Inc. in the United States and other countries. ARM is an unregistered trademark of ARM Holdings plc in the United States and other countries. The architecture of the chipset 210 includes a core and memory control group 220 and an I/O controller hub 250 that exchanges information (for example, data, signals, commands, etc.) via a direct management interface (DMI) 242 or a link controller 244. In FIG. 2, the DMI 242 is a chip-to-chip interface (sometimes referred to as being a link between a "northbridge" and a "southbridge"). The core and memory control group 220 include one or more processors 222 (for example, single or multi-core) and a memory controller hub 226 that exchange information via a front side bus (FSB) 224; noting that components of the group 220 may be integrated in a chip that supplants the conventional "northbridge" style architecture. One or more processors 222 comprise internal arithmetic units, registers, cache memory, busses, I/O ports, etc., as is well known in the art.

In FIG. 2, the memory controller hub 226 interfaces with memory 240 (for example, to provide support for a type of RAM that may be referred to as "system memory" or "memory"). The memory controller hub 226 further includes a low voltage differential signaling (LVDS) interface 232 for a display device 292 (for example, a CRT, a flat panel, touch screen, etc.). A block 238 includes some technologies that may be supported via the LVDS interface 232 (for example, serial digital video, HDMI/DVI, display port). The memory controller hub 226 also includes a PCI-express interface (PCI-E) 234 that may support discrete graphics 236.

In FIG. 2, the I/O hub controller 250 includes a SATA interface 251 (for example, for HDDs, SDDs, etc., 280), a PCI-E interface 252 (for example, for wireless connections 282), a USB interface 253 (for example, for devices 284 such as a digitizer, keyboard, mice, cameras, phones, microphones, storage, other connected devices, etc.), a network interface 254 (for example, LAN), a GPIO interface 255, a LPC interface 270 (for ASICs 271, a TPM 272, a super I/O 273, a firmware hub 274, BIOS support 275 as well as various types of memory 276 such as ROM 277, Flash 278, and NVRAM 279), a power management interface 261, a clock generator interface 262, an audio interface 263 (for example, for speakers 294), a TCO interface 264, a system management bus interface 265, and SPI Flash 266, which can include BIOS 268 and boot code 290. The I/O hub controller 250 may include gigabit Ethernet support.

The system, upon power on, may be configured to execute boot code 290 for the BIOS 268, as stored within the SPI Flash 266, and thereafter processes data under the control of one or more operating systems and application software (for example, stored in system memory 240). An operating system may be stored in any of a variety of locations and accessed, for example, according to instructions of the BIOS 268. As described herein, a device may include fewer or more features than shown in the system of FIG. 2.

Information handling device circuitry, as for example outlined in FIG. 1 or FIG. 2, may be used in devices such as tablets, smart phones, personal computer devices generally, and/or electronic devices which users may use in or with systems as described herein. For example, the circuitry outlined in FIG. 1 may be implemented in a tablet or smart phone embodiment, whereas the circuitry outlined in FIG. 2 may be implemented in a personal computer embodiment.

Figure 3:
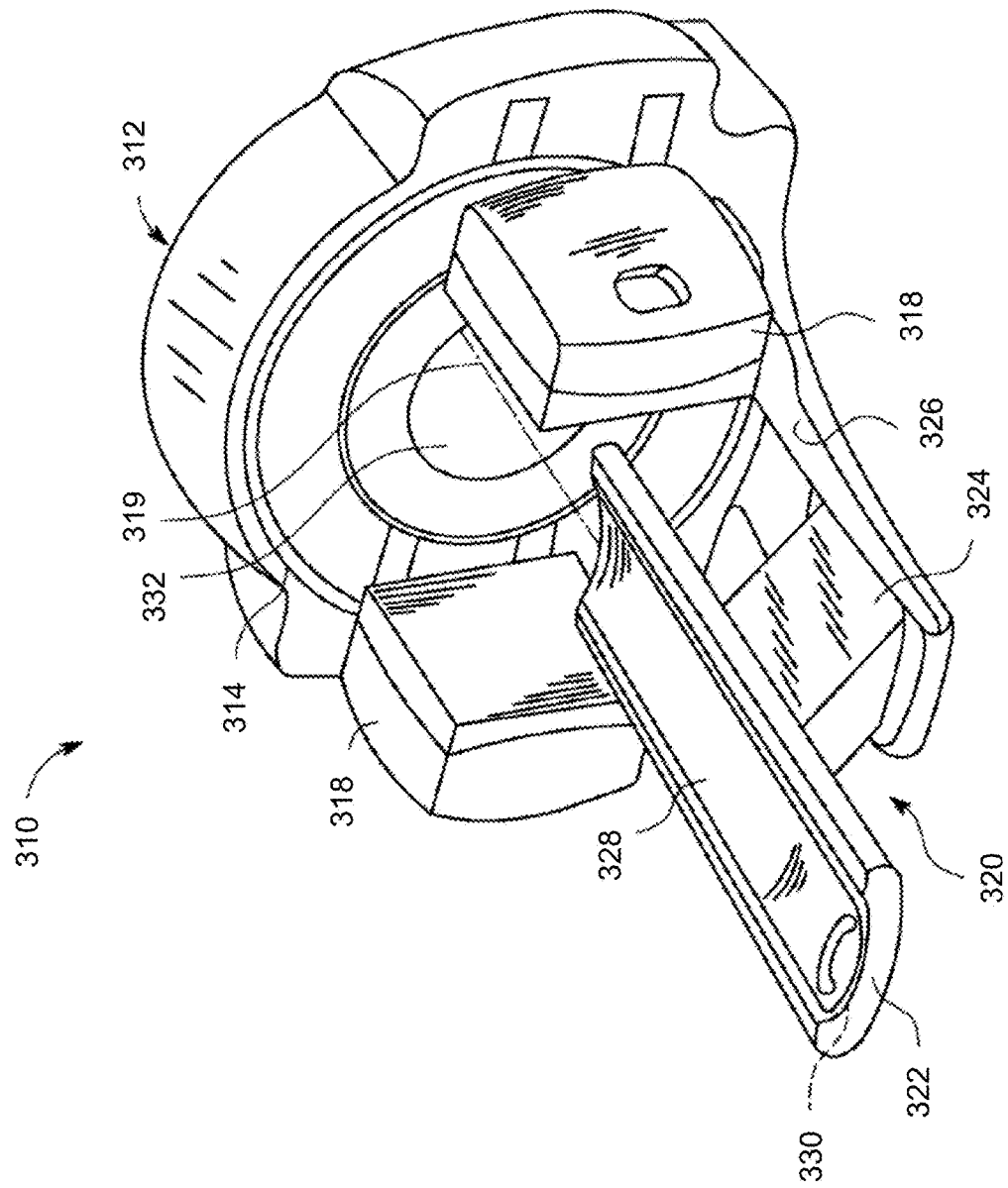
FIG. 3 illustrates another embodiment of an imaging device that may use the disclosed embodiments.

Referring to FIG. 3, the pixelated detectors and/or gamma cameras of the various embodiments may be provided as part of different types of imaging systems, for example, nuclear medicine (NM) imaging systems such as positron emission tomography (PET) imaging systems, single-photon emission computed tomography (SPECT) imaging systems and/or x-ray imaging systems and x-ray computed tomography (CT) imaging systems, among others. For example, FIG. 3 is a perspective view of an exemplary embodiment of a medical imaging system 310 constructed in accordance with various embodiments, which in this embodiment is a SPECT imaging system. The system 310 includes an integrated gantry 312 that further includes a rotor 314 oriented about a gantry central bore 332. The rotor 314 is configured to support one or more NM pixelated cameras 318 (two cameras 318 are shown), such as, but not limited to gamma cameras, SPECT detectors, multi-layer pixelated cameras (e.g., Compton camera) and/or PET detectors. It should be noted that when the medical imaging system 310 includes a CT camera or an x-ray camera, the medical imaging system 310 also includes an x-ray tube (not shown) for emitting x-ray radiation towards the detectors. In various embodiments, the cameras 318 are formed from pixelated detectors as described in more detail herein. The rotors 314 are further configured to rotate axially about an examination axis 519.

A patient table 320 may include a bed 322 slidingly coupled to a bed support system 324, which may be coupled directly to a floor or may be coupled to the gantry 312 through a base 326 coupled to the gantry 312. The bed 322 may include a stretcher 328 slidingly coupled to an upper surface 330 of the bed 322. The patient table 320 is configured to facilitate ingress and egress of a patient (not shown) into an examination position that is substantially aligned with examination axis 319. During an imaging scan, the patient table 320 may be controlled to move the bed 322 and/or stretcher 328 axially into and out of a bore 332. The operation and control of the imaging system 310 may be performed in any manner known in the art. It should be noted that the various embodiments may be implemented in connection with imaging systems that include rotating gantries or stationary gantries.

Figure 4:
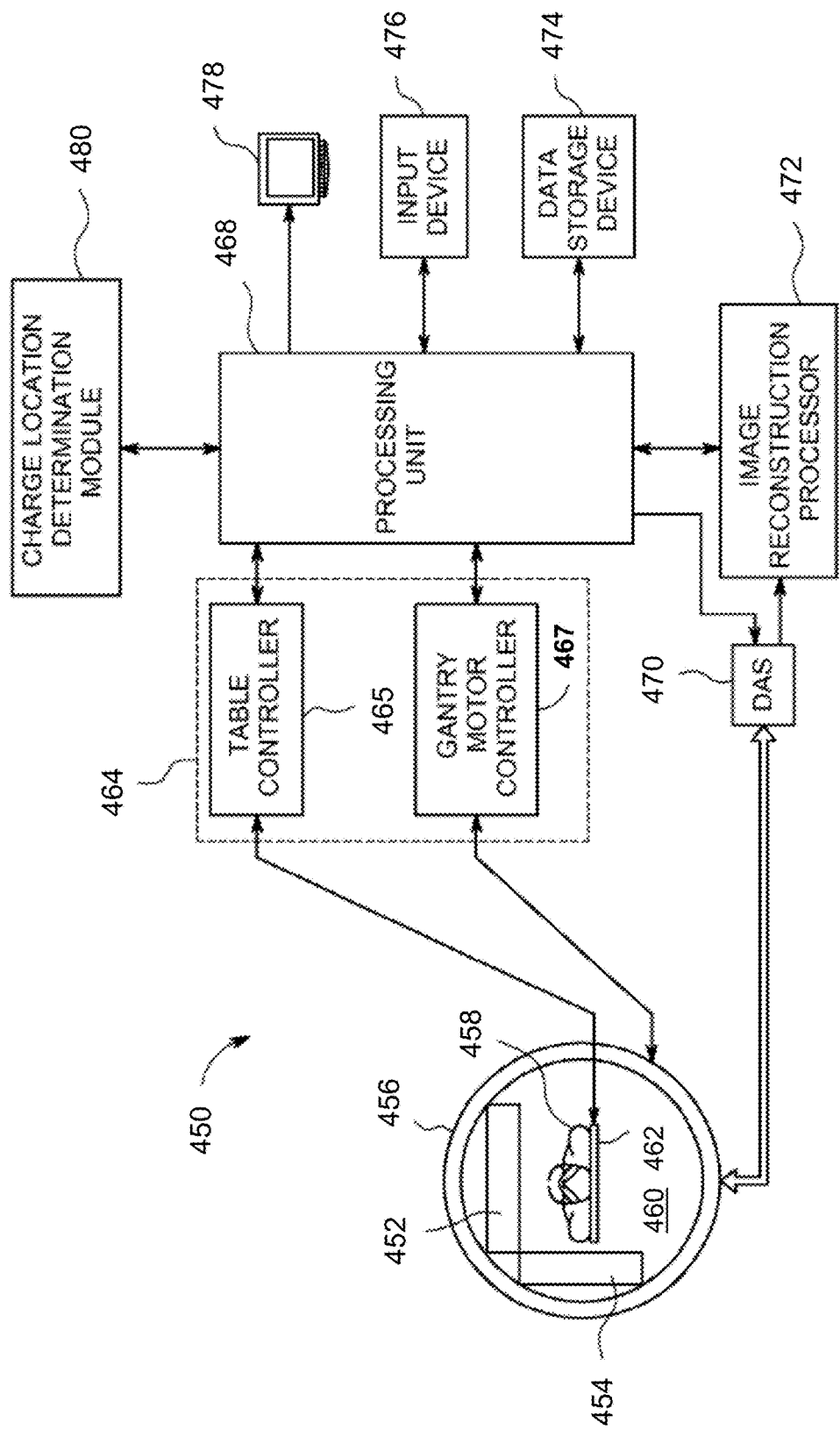
FIG. 4 illustrates a further example of information handling device circuitry.

Referring now to FIG. 4 which illustrates a block diagram illustrating an imaging system 450 that has a plurality of pixelated imaging detectors and/or gamma cameras configured in accordance with various embodiments mounted on a gantry. It should be noted that the imaging system may also be a multi-modality imaging system, such as an NM/CT imaging system. The imaging system 450, illustrated as a SPECT imaging system, generally includes a plurality of pixelated imaging detectors 452 and 454 (two are illustrated) mounted on a gantry 456. It should be noted that additional imaging detectors may be provided. The imaging detectors 452 and 454 are located at multiple positions (e.g., in an L-mode configuration, as shown) with respect to a patient 458 in a bore 460 of the gantry 456. The patient 458 is supported on a patient table 462 such that radiation or imaging data specific to a structure of interest (e.g., the heart) within the patient 458 may be acquired. It should be noted that although the imaging detectors 452 and 454 are configured for movable operation (azimuthally around, radially in or out, rotatably around an axis, tiltably about a pivot, and the like) of the gantry 456, in some imaging systems, imaging detectors are fixedly coupled to the gantry 456 and in a stationary position, for example, in a PET imaging system (e.g., a ring of imaging detectors). It also should be noted that the imaging detectors 452 and 454 may be formed from different materials as described herein and provided in different configurations known in the art, such as flat or curved panels.

One or more collimators may be provided in front of the radiation detection face (not shown) of one or more of the imaging detectors 452 and 454. The imaging detectors 452 and 454 acquire a 2D image that may be defined by the x and y location of a pixel and the location of the imaging detectors 452 and 454. The radiation detection face (not shown) is directed towards, for example, the patient 458, which may be a human patient, animal, airport baggage, or the like.

A controller unit 464 may control the movement and positioning of the patient table 462 with respect to the imaging detectors 452 and 454 and the movement and positioning of the imaging detectors 452 and 454 with respect to the patient 458 to position the desired anatomy of the patient 458 within the fields of view (FOVs) of the imaging detectors 452 and 454, which may be performed prior to acquiring an image of the anatomy of interest. The controller unit 464 may have a table controller 465 and a gantry motor controller 467 that each may be automatically commanded by a processing unit 468, manually controlled by an operator, or a combination thereof. The table controller 465 may move the patient table 462 to position the patient 458 relative to the FOV of the imaging detectors 452 and 454. Additionally, or optionally, the imaging detectors 452 and 454 may be moved, positioned or oriented relative to the patient 458 or rotated about the patient 458 under the control of the gantry motor controller 467.

The imaging data may be combined and reconstructed into an image, which may comprise 2D images, a 3D volume or a 3D volume over time (4D).

A Data Acquisition System (DAS) 470 receives analog and/or digital electrical signal data produced by the imaging detectors 452 and 454 and decodes the data for subsequent processing as described in more detail herein. An image reconstruction processor 472 receives the data from the DAS 470 and reconstructs an image using any reconstruction process known in the art. A data storage device 474 may be provided to store data from the DAS 470 or reconstructed image data. An input device 476 also may be provided to receive user inputs and a display 478 may be provided to display reconstructed images. A charge location determination module 480 may provide x and y position for each gamma photon interaction with the pixelated imaging detectors 452 and 454. In an embodiment, a depth-of-interaction z position may be determined.

In an embodiment, the imaging device may be installed in a location for security scanning. For example, the device may be in an airport security checkpoint, a baggage screening location, or the like. The device may comprise a plurality of x-ray sources and a plurality of pixelated photon detector arrays. In an embodiment, the imaging device may be permanently anchored, moveable, or completely portable. For example, an imaging device may be a hand-held device for use by first responders, security, or assessment teams. Other uses outside of a security setting are contemplated and are disclosed. As should be understood by one skilled in the art, both healthcare imaging and security screening are merely examples. Other possible applications for the techniques as described herein are possible and contemplated.

In an embodiment, the receiving equipment may contain sensors that are sensitive to radiological particles or photons. The receiving equipment may record communication events, also referred to as interactions, on an array of sensors located in the receiving equipment. Each of the sensors in the array may be represented as a pixel in the final image. During the course of imaging, a photon or particle may strike one or more pixel detection units. In an embodiment, the signals received from the one or more pixel detection units may be used to determine characteristics of a photon interaction. In a healthcare setting this may allow healthcare professionals to achieve better imaging in less time and with less radiolabeling delivered to a patient which may result in better treatment plans and decrease medical costs, for example, better resolution may be achieved and imaging sessions' durations may be reduced.

Figure 5:
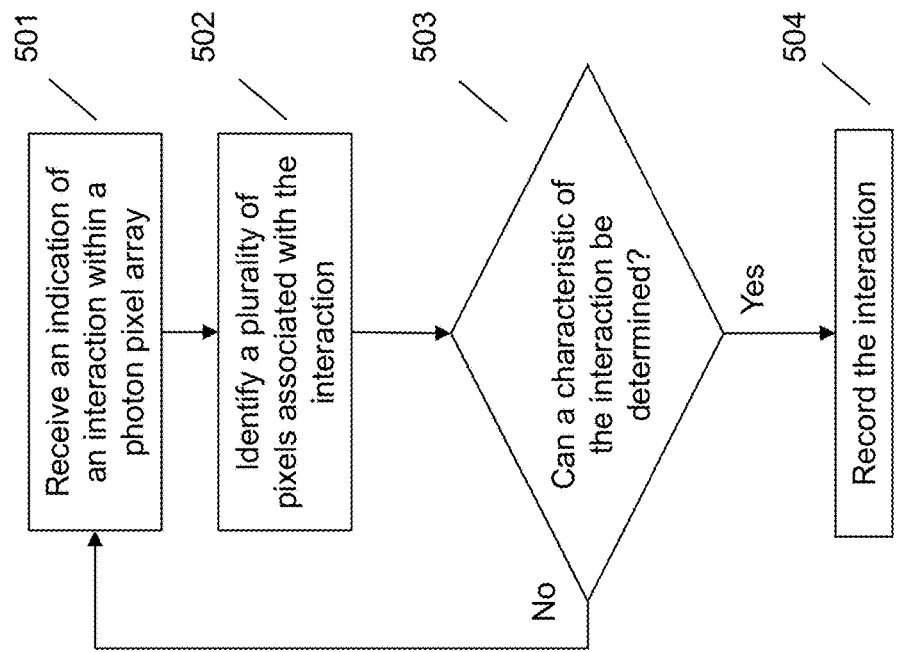
FIG. 5 illustrates a method of determining a characteristic of an interaction using a plurality of pixels.

Referring now to FIG. 5, an embodiment of an imaging device may be in a healthcare setting, security screening, manufacturing, or any application where an imaging device may be utilized. For example, the imaging device may be a radiological imaging device in which radiological matter (consisting of particles or photons) is either transmitted through or injected into and emitted from a patient's body. Another example may include an airport or port of entry device used to scan for radiation or other material of interest for security purposes. Another example of an imaging device may be used by first responder to determine environmental conditions and/or safety of a location. Other uses are contemplated and disclosed.

At 501 an embodiment may receive or capture an interaction occurring within a photon detector pixel array. Receiving or capturing an interaction may include receiving one or more signals from one or more pixel detection units that indicate an interaction has occurred. For readability, the discussion herein will refer to a photon as that object which is causing the interaction and resulting in the signals. However, it should be understood that the object may include a photon, light of any spectrum, a radiological particle, or any type of energy which the detection unit is capable of detecting. A photon detector pixel array may be one or more pixel detector units. A photon detector pixel array may be organized in any configuration such as a grid, a brick pattern, an interspersed pattern, or the like. The photon detector pixel array may be oriented in a flat plane, curved plane, or the like. In other words, the photon detector pixel array may be arranged in a manner that is suitable for detecting interactions from an emission source, and may be different for different applications. For example, a photon from an emission source may interact with one or more pixels on a photon pixel array as part of an imaging unit in a medical setting.

In an embodiment a pixel (picture element) refers to a discrete location on the imaging hardware surface that may be only a subset of the imaged area. The data or communication from a pixel or plurality of pixels may be used to form an image as a composite from the one or more pixels.

An imaging device may use many methods to detect a communication event from a pixel. For example, in a consumer camera a pixel represents the intensity and wavelength of the visible light detected by the pixel. As another example, radiological imaging devices used in cancer screenings, radiation detectors, and the like, use a type of atomic particle or photon emitted by a source and measurable by a sensor with associated circuitry to provide both a location and intensity (or count density) of the radiological particles or photons detected. Using the communication events from the pixels, an image may be created based upon the location, intensity, and energy or wavelength of the communication event from the pixel. In other words, an embodiment may use the signal transmitted from the pixel during imaging to create an image based upon the information contained within the signal. The data may be collected from multiple pixels to create an image of a larger area.

In an embodiment with a semiconductor detector material, a photon detector pixel array may have two sides with metallic electrodes deposited on the semiconductor detector crystal. A first side may comprise a plurality of pixels, also referred to as the pixelated side, which may be arranged in a grid pattern. This side may be coupled to read-out electronics that can capture the signal from the pixelated side. In the case of CdZnTe or CdTe, in which the electron mobility is much larger than hole mobility, the pixelated side may be the anode side of the array and provide anode signals. In some configurations, this side may be connected to ground potential. In an embodiment, a second side of the detector pixel array may be substantially opposite the first side, for example, in the case of a thick sheet-like detector, the first side may be the bottom side, and the second side may be the top side, typically the side from which gamma photons may be incident upon the detector. This second side of the detector pixel array may be a cathode and may be connected to a negative voltage bias.

At 502 an embodiment may identify a plurality of pixels associated with an interaction of a photon. For example, when a photon interacts with the detector, one or more pixels produce a signal corresponding to that interaction. As an example, as the photon moves through the pixel array, the photon interacts with different pixels. Each of these pixels then generates a signal indicating some form of interaction or contact. In an embodiment, a central pixel may be identified. This central pixel may be associated with the place of "rest" of the photon, for example, the location of a photoelectric interaction. In other words, the photon has stopped moving through the pixel array. Identification of the central pixel may be performed using one or more characteristics. For example, a central pixel may be identified as the pixel with the highest energy detected from a photon event. However, it may be possible that the central pixel does not represent the pixel having the highest energy detected by a photon interaction. As an example, if two pixels share the same level of interaction, they may provide the same highest energy value. In this case, a pixel may simply be characterized as a central pixel.

In addition to the central pixel, the system may identify one or more neighboring pixels. In an embodiment, one or more identified neighboring pixels may be in any physical location with respect to the central pixel. In other words, the neighboring pixels do not have to be direct neighbors of the central pixel. Rather, one or more neighboring pixels may be identified as pixels that receive energy from a photon that is less than the energy received by the central pixel. In other words, as the photon moves through the pixel array it may interact, for example by Compton scattering, with pixels other than the central pixel. These pixels may be identified as neighboring pixels. The one or more neighboring pixels may be in any type of configuration with respect to the central pixel. For example, the neighboring pixels may be in a "ring" configuration around the central pixel. As another example, one or more neighboring pixels may be located to one or more sides of the central pixel. As a final example, a neighboring pixel may be a single pixel adjacent to the central pixel. Each of the neighboring pixels may have different signals with respect to each other and/or the central pixel. In other words, each of the signals from the neighboring pixels may be the same, different, or a combination thereof, with respect to other neighboring pixels and/or the central pixel.

Figure 6:
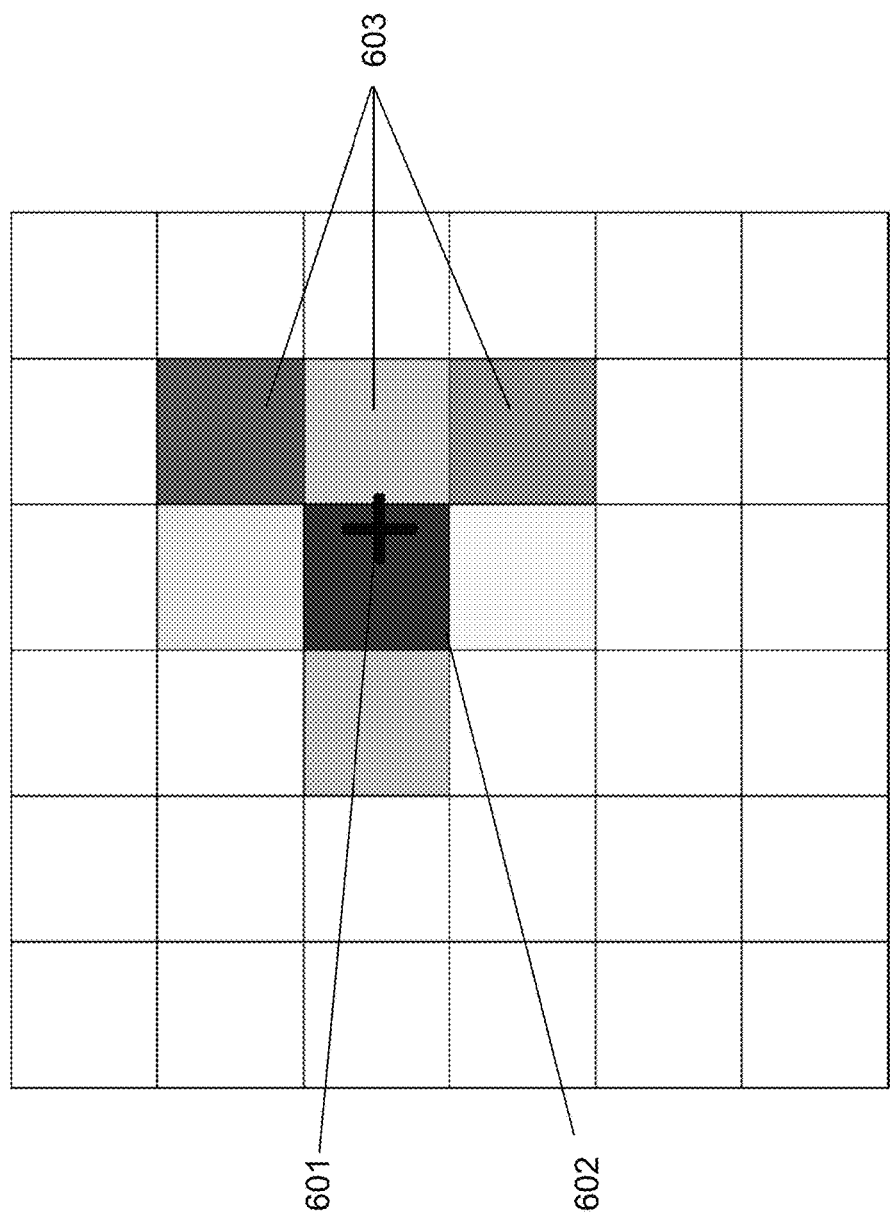
FIG. 6 illustrates an interaction and the effect of the interaction on a plurality of pixels.

For example, referring to FIG. 6, an interaction is illustrated at the plus sign ("+") 601. This interaction indicates the 2D location of "rest" of the photon. The central pixel 602 is the pixel that provided the highest energy signal with respect to the photon interaction. The neighboring pixels, represented by 603 but not all inclusive, indicate pixels that provided an energy signal but that was not as great as the central pixel 602. The different shades of gray indicate the different energy levels that were detected at the different pixels. In other words, the central pixel 602 is represented by the darkest gray, thereby indicating the highest energy signal. The lighter shades of gray of the neighboring pixels 603 indicate that energy signals were received but at values less than the central pixel 602.

At 503 an embodiment may identify whether a characteristic of the interaction may be determined. The system may determine many different characteristics with regard to the interaction, for example, the characteristic may include time, position, (maybe including depth), energy, or the like. To determine a characteristic, the system may receive a signal from one or more pixels, for example, the central and neighboring pixels. For example, a photon may not enter a detector pixel array at a right angle of incidence. Thus, as the photon is traveling through the detector, the photon may interact with more than one pixel. In other words, as a photon enters the detector pixel plane, the interaction may "share" characteristics (i.e. energy) with one or more neighboring pixels. Different characteristics may be determined using the signals received from not only the central pixel, but also the neighboring pixels. The system may use these signals to directly identify a characteristic or may attribute these signals to signals from other pixels. The system may determine one or more characteristics simultaneously or at different times.

In an embodiment, the determined characteristic may include a depth of the interaction. In an embodiment, a depth of the interaction may be determined by first identifying a multidimensional space of two or more dimensions comprising peak signal amplitude responses along multiple axes: 1) positive polarity of the central pixel, 2) positive polarity of the neighboring pixels, and optionally, 3) negative polarity of the neighboring pixel. The next step is to identify one or more clusters within this multidimensional space which represent one or more mechanisms of interpixel charge sharing or hole trapping, which is depth dependent.

Each of these signals may also have an associated amplitude representing, for example, an interaction energy of the signal. Therefore, the signals from a pixel may include signals having peak amplitudes of positive polarity signals and peak amplitudes of negative polarity signals. Using these signals from the central and neighboring pixels, the system can determine a depth of the interaction, for example, by clustering these signals in the multidimensional space. As stated above, the system and method described herein only capture peak amplitude signals from the anode portion of the detector. Thus, by analyzing and correlating the amplitude peaks of both positive and negative polarity signals from all of the pixels (e.g., central pixel and neighboring pixels), the system can determine at what depth the interaction occurred. Thus, the system can determine a position characteristic, including the depth of the interaction.

The system may also determine other characteristics using the signals from one or more neighboring pixels in addition to the signal from the central pixel. For example, using the signals from one or more neighboring pixels, in addition to the central pixel, may allow a better resolution with respect to characteristics such as time, position, energy, or the like. Determination of some of these characteristics may be completed using conventional techniques except that the signals from the neighboring pixels are taken into account with the signals of the central pixel, which provides a more precise or accurate determination of the characteristic.

For example, the system may determine a position of the interaction with respect to a two-dimensional position that is more precise than conventional systems and methods. For example, the interaction of a photon with neighboring pixels may adjust the location of a photon to a sub-pixel resolution, rather than merely a pixel resolution. As an example, referring to FIG. 6, the interaction 601 occurs on the right side of the central pixel 602 with respect to an imaginary center line of the pixel. Using the information from the neighboring pixels, the system may identify that this interaction 601 occurred on right side of the central pixel 602, instead of merely identifying that the interaction 601 occurred at the central pixel 602. For example, by identifying the signals from the neighboring pixels, the system can determine which neighboring pixels had higher signals as compared to other neighboring pixels. Due to the fact that pixels closer to the interaction will have a higher signal, if the interaction occurs off-center, the neighboring pixels closer to the interaction will provide a higher signal than pixels further from the interaction. Thus, by identifying which pixels have a higher signal, the system can determine at which side of the pixel the interaction occurred.

For example, the system may use a weighted average to identify sub-pixel position information. As an illustrative example, if the detector pixel array receives an interaction of a photon where one neighboring pixel receives $\frac{2}{3}$ of the interaction that occurs outside of the central pixel and another neighboring pixel receives $\frac{1}{3}$ of the interaction that occurs outside of the central pixel, then the system may determine where the event occurred along the line of the centers of the two pixels by weighting these two interactions along the central pixel. In other words, the interaction may not fall on the center of the area of a pixel and the neighboring pixels allow for a more precise location of the interacting photon to be determined.

As another example of a more accurate or precise characteristic determination, the system can determine a more precise energy of the interaction. When the photon interacts with a pixel, neighboring pixels may receive a portion of the interaction. This is referred to as shared charge. Thus, the system may attribute the charge received by a neighboring pixel to the central pixel to provide a more accurate representation of the actual energy of the interaction. To provide this more accurate representation the system may correct the energy value received from the central pixel. The correction may include adding the shared charge of one or more neighboring pixels to the response of the central pixel. In other words, if an interaction of a photon is detected by a pixel array, then the charge detected by neighboring pixels may be added to the value of the charge of the center pixel. As an example, if a photon interacts with a detector pixel array in which 80% of the charge is received at the central pixel and 20% of the charge is received at neighboring pixels, then the 20% charge of the neighboring pixels may be assigned to the center pixel.

Another characteristic may include a time of the interaction. To determine the time of interaction, the system determines the depth of the interaction, as explained above. The system also determines the times of the plurality of responses. Then based upon the depth of the interaction and the time of the response, the system can determine the intervals of time that are required for the plurality of pixels to provide the responses. In other words, if the system knows the depth of interaction and the time at which the response was received, the system can use a calculation technique or algorithm, for example, a time of flight calculation, to determine at what time the interaction actually occurred.

If one or more characteristics cannot be determined for an interaction at 503, the system may ignore the interaction and receive information related to a new interaction at 501. If, on the other hand, the system can determine one or more characteristics at 503, the system may record data related to the interaction at 504. This recorded data may be analyzed in real-time or saved for later analysis. Additionally, the recorded data may be used by the systems as described herein to generate one or more images of the object that is being scanned using the imaging device.

The various embodiments described herein thus represent a technical improvement to imaging devices that may require high sensitivity and resolution to the material imaged. An embodiment allows for the use of a plurality of neighboring pixels to determine characteristics of an interaction by a photon. Using the techniques described herein, rather than requiring longer imaging sessions and/or higher radiological doses, a more complete image may be achieved with lower imaging session durations and/or lower radiological doses. Such a system results in more accurate imaging, less device down-time, and lower costs associated with the imaging procedure.

As will be appreciated by one skilled in the art, various aspects may be embodied as a system, method or device program product. Accordingly, aspects may take the form of an entirely hardware embodiment or an embodiment including software that may all generally be referred to herein as a "circuit," "module" or "system." Furthermore, aspects may take the form of a device program product embodied in one or more device readable medium(s) having device readable program code embodied therewith.

It should be noted that the various functions described herein may be implemented using instructions stored on a device readable storage medium such as a non-signal storage device that are executed by a processor. A storage device may be, for example, an electronic, magnetic, optical, electromagnetic, infrared, or semiconductor system, apparatus, or device, or any suitable combination of the foregoing. More specific examples of a storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a storage device is not a signal and "non-transitory" includes all media except signal media.

Program code embodied on a storage medium may be transmitted using any appropriate medium, including but not limited to wireless, wireline, optical fiber cable, RF, et cetera, or any suitable combination of the foregoing.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of connection or network, including a local area network (LAN) or a wide area network (WAN), or the connection may be made through other devices (for example, through the Internet using an Internet Service Provider), through wireless connections, e.g., near-field communication, or through a hard wire connection, such as over a USB connection.

Example embodiments are described herein with reference to the figures, which illustrate example methods, devices and program products according to various example embodiments. It will be understood that the actions and functionality may be implemented at least in part by program instructions. These program instructions may be provided to a processor of a device, a special purpose information handling device, or other programmable data processing device to produce a machine, such that the instructions, which execute via a processor of the device implement the functions/acts specified.

It is worth noting that while specific blocks are used in the figures, and a particular ordering of blocks has been illustrated, these are non-limiting examples. In certain contexts, two or more blocks may be combined, a block may be split into two or more blocks, or certain blocks may be re-ordered or re-organized as appropriate, as the explicit illustrated examples are used only for descriptive purposes and are not to be construed as limiting.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A method, comprising:
   receiving a plurality of responses to an interaction occurring within a photon detector pixel array, wherein the photon detector pixel array comprises a plurality of pixels, wherein the plurality of responses does not correspond to responses from a cathode of the photon detector pixel array;
   identifying a subset of the plurality of pixels associated with the interaction, wherein each of the subset of the plurality of pixels corresponds to at least one of the plurality of responses; and determining, from the plurality of responses, a characteristic of the interaction, wherein the characteristic comprises at least one of: time, position, and energy of the interaction.

2. The method of claim 1, wherein the plurality of pixels comprise a central pixel and a plurality of neighboring pixels, wherein the central pixel comprises the pixel having the highest amplitude response to the interaction.

3. The method of claim 1, wherein the characteristic comprises the energy of the interaction, wherein the determining the energy of the interaction comprises adding the plurality of responses.

4. The method of claim 1, wherein the interaction is associated with an incident photon or particle.

5. The method of claim 1, wherein each response by the plurality of pixels comprises at least one of a positive polarity peak signal amplitude and a negative polarity peak signal amplitude.

6. The method of claim 5, wherein the characteristic comprises a position of the interaction comprising a depth of the interaction, wherein the determining the depth of the interaction comprises identifying a multidimensional cluster of peak signal amplitudes of the plurality of the responses.

7. The method of claim 6, wherein the characteristic comprises a time of the interaction, wherein the determining the time of the interaction comprises determining the depth of the interaction, determining the times of the plurality of responses, and determining the intervals of time that are required for the plurality of pixels to provide the plurality of responses.

8. The method of claim 1, wherein the characteristic comprises a position of the interaction and wherein the determining the position comprises determining a sub-pixel position of the interaction by identifying an amount of interaction response by the central pixel and an amount of interaction response by at least one neighboring pixel.

9. The method of claim 1, wherein the photon detector pixel array comprises an array of pixelated semiconductor detectors selected from the group consisting of: CdZnTe, CdTe, HgI, Si, and direct-conversion materials.

10. An apparatus, comprising:
a photon detector pixel array comprising a plurality of pixels;
a processor operatively coupled to the photon detector pixel array;
a memory device that stores instructions executable by the processor to:
receive a plurality of responses to an interaction occurring within the photon detector pixel array, wherein the plurality of responses does not correspond to responses from a cathode of the photon detector pixel array;
identify a subset of the plurality of pixels associated with the interaction, wherein each of the subset of the plurality of pixels corresponds to at least one of the plurality of responses; and
determine, from the plurality of responses, a characteristic of the interaction, wherein the characteristic comprises at least one of: time, position, and energy of the interaction.

11. The apparatus of claim 10, wherein the plurality of pixels comprises a central pixel and a plurality of neighboring pixels, wherein the central pixel comprises the pixel having the highest amplitude response to the interaction.

12. The apparatus of claim 10, wherein the characteristic comprises the energy of the interaction, wherein the determining the energy of the interaction comprises adding the plurality of responses.

13. The apparatus of claim 10, wherein the interaction is associated with an incident photon or particle.

14. The apparatus of claim 10, wherein each response by the plurality of pixels comprises at least one of a positive polarity peak signal amplitude and a negative polarity peak signal amplitude.

15. The apparatus of claim 14, wherein the characteristic comprises a position of the interaction comprising a depth of the interaction, wherein the determining the depth of the interaction comprises identifying a multidimensional cluster of peak signal amplitudes of the plurality of the responses.

16. The apparatus of claim 15, wherein the characteristic comprises a time of the interaction, wherein the determining the time of the interaction comprises determining the depth of the interaction, determining the times of the plurality of responses, and determining the intervals of time that are required for the plurality of pixels to provide the plurality of responses.

17. The apparatus of claim 10, wherein the characteristic comprises a position of the interaction and wherein the determining the position comprises determining a sub-pixel position of the interaction by identifying an amount of interaction response by the central pixel and an amount of interaction response by at least one neighboring pixel.

18. The apparatus of claim 10, wherein the photon detector pixel array comprises an array of pixelated semiconductor detectors selected from the group consisting of: CdZnTe, CdTe, HgI, Si, and direct-conversion materials.

19. A product, comprising:
a storage device that stores code, the code being executable by a processor and comprising:
code that receives a plurality of responses to an interaction occurring within a photon detector pixel array, wherein the photon detector pixel array comprises a plurality of pixels, wherein the plurality of responses does not correspond to responses from a cathode of the photon detector pixel array;
code identifies a subset of the plurality of pixels associated with the interaction, wherein each of the subset of the plurality of pixels corresponds to at least one of the plurality of responses; and
code that determines, from the plurality of responses, a characteristic of the interaction, wherein the characteristic comprises at least one of: time, position, and energy of the interaction.

* * * * *